United States Patent
Erratico et al.

(10) Patent No.: US 6,693,039 B2
(45) Date of Patent: Feb. 17, 2004

(54) PROCESS FOR FORMING A BURIED CAVITY IN A SEMICONDUCTOR MATERIAL WAFER AND A BURIED CAVITY

(75) Inventors: Pietro Erratico, Milan (IT); Enrico Sacchi, Pavia (IT); Flavio Villa, Milan (IT); Gabriele Barlocchi, Cornaredo (IT); Pietro Corona, Rome (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 81 days.

(21) Appl. No.: 09/797,206

(22) Filed: Feb. 27, 2001

(65) Prior Publication Data

US 2001/0049200 A1 Dec. 6, 2001

(30) Foreign Application Priority Data

Feb. 29, 2000 (EP) ............................. 00830148

(51) Int. Cl.[7] ............................. H01L 21/302
(52) U.S. Cl. ............... 438/700; 438/701; 438/745; 438/753
(58) Field of Search ............... 438/700, 745, 438/753, 701

(56) References Cited

U.S. PATENT DOCUMENTS

| 3,969,168 | A | * | 7/1976 | Kuhn ........................ 438/437 |
| 4,993,143 | A | * | 2/1991 | Sidner et al. ............. 29/621.1 |
| 5,773,870 | A | * | 6/1998 | Su et al. .................... 257/531 |
| 6,001,666 | A | * | 12/1999 | Diem et al. .................. 438/52 |
| 6,015,761 | A | * | 1/2000 | Merry et al. ............... 438/727 |

FOREIGN PATENT DOCUMENTS

| DE | 196 21 349 A | 12/1997 | | |
| EP | 0 658 927 A | 6/1995 | | |
| IT | 1043770 A1 | * | 4/1999 | ......... H01L/21/764 |
| IT | 1130631 A1 | * | 2/2000 | ......... H01L/21/308 |
| JP | 62076783 | 4/1987 | | |
| JP | 62076784 | 4/1987 | | |
| SE | 960177-7 A | 11/1997 | | |
| WO | WO9417558 | 8/1994 | | |

OTHER PUBLICATIONS

Zou et al., Single–Chip Fabrication of Integrated Fluid System (IFS), *IEEE Workshop on Micro Electro Mechanical Systems*, New York, NY: IEEE, Jan. 25, 1998, pp 448–453.

"Method of Making Separate Regions of Various Average Depths with one Anisotropic Etch," *Research Disclosure*, GB, Industrial Opportunities Ltd., Havant, No. 316, Aug. 1990.

Sugiyama et al., "Micro–Diaphram Pressure Sensor," *1986 IEEE*, 8.3, 184–IEDM, pp 184–187.

\* cited by examiner

*Primary Examiner*—Nadine G. Norton
*Assistant Examiner*—Lynette T. Umez-Eronini
(74) *Attorney, Agent, or Firm*—Lisa K. Jorgenson; Harold H. Bennett II; Seep IP Law Group PLLC

(57) ABSTRACT

The process comprises the steps of forming, on top of a semiconductor material wafer, a holed mask having a lattice structure and comprising a plurality of openings each having a substantially square shape and a side with an inclination of 45° with respect to the flat of the wafer; carrying out an anisotropic etch in TMAH of the wafer, using said holed mask, thus forming a cavity, the cross section of which has the shape of an upside-down isosceles trapezium; and carrying out a chemical vapor deposition using TEOS, thus forming a TEOS layer which completely closes the openings of the holed mask and defines a diaphragm overlying the cavity and on which a suspended integrated structure can subsequently be manufactured.

17 Claims, 3 Drawing Sheets

PROCESS FOR FORMING A BURIED CAVITY IN A SEMICONDUCTOR MATERIAL WAFER AND A BURIED CAVITY

TECHNICAL FIELD

The present invention regards a process for forming a buried cavity in a semiconductor material wafer.

BACKGROUND OF THE INVENTION

As is known, the possibility of manufacturing RF integrated circuits in CMOS or BiCMOS technology would make it possible to obtain lower consumption and lower costs as compared to normal circuits made using gallium arsenide (GaAs).

At present, however, this possibility is limited by the poor efficiency of the passive elements, and in particular by the inductors, on account of the high parasitic capacitances of the substrate which give rise to low resonance frequencies and preclude the use of high-frequency inductors, and on account of the high conductivity of the substrate, which markedly limits the quality factor Q of the inductor.

Typical values of the quality factor Q for integrated inductors made on GaAs are of the order of 20 for frequencies of 2 GHz, whereas values of the quality factor Q smaller than 5 are obtained for inductors integrated on high-conductivity silicon substrates (CMOS processes).

To increase the quality factor Q of integrated inductors in the entire range of interest it is important to reduce both the losses due to the metallizations that make up the coil and losses due to the substrate.

The losses due to metallizations can be reduced by using aluminum or copper thick layers having relatively high electrical conductivity. However, the skin effect, which, for example, for copper is of the order of 1.5 $\mu$m at a frequency of 1 GHz, limits the thickness of the metallization layer in which the current effectively flows. It follows therefore that there is no point in using metallization regions having a thickness of over 2 $\mu$m to seek to increase the inductor quality factor Q.

The losses due to the substrate can be reduced by using high-resistivity substrates. However, this solution is not compatible with CMOS technology, which enables only low-resistivity substrates to be obtained.

One of the techniques used to reduce the losses due to the substrate envisages the formation of a thick oxide layer, namely of over 60 $\mu$m, underneath the inductor, which limits the currents inductively generated in the substrate, thus improving the inductor quality factor Q and at the same time enabling higher resonance frequencies to be obtained and wider metallization strips to be used, in this way also reducing ohmic dissipation.

This technique is schematically illustrated in FIGS. 1a–1c and envisages the formation, in a wafer 1 of monocrystalline silicon, of deep trenches 2 (FIG. 1a), complete thermal oxidation of the columns 3 of silicon comprised between each pair of contiguous trenches 2 (FIG. 1b), and then chemical vapor deposition (CVD) of a layer of TEOS 4 (tetraethyl orthosilicate), the purpose of which is to complete filling of the trenches and to prepare the surface of the substrate (planarization) for the subsequent forming of the inductor (FIG. 1c).

This technique is, however, very costly in that it requires a long time for forming the trenches (1 $\mu$m/min) and moreover with current etching machines it is not possible to carry out the operation simultaneously on a number of wafers, but only on a single wafer at a time.

An alternative technique that has been proposed recently and that makes it possible to reduce losses due to the substrate is described in "PROCEEDINGS OF THE IEEE," vol. 86, No. 8, August 1998, page 1632, and essentially envisages the creation of a cavity or air gap underneath the inductor by removing the silicon underneath the inductor by means of anisotropic chemical etches made using potassium hydroxide (KOH), tetramethyl ammonium hydroxide (TMAH), etc., and employing a sacrificial polycrystalline-silicon layer.

This technique is schematically illustrated in FIGS. 2a–2c, and essentially involves the deposition and definition, using a special mask, of a sacrificial polycrystalline-silicon layer 5 on the top surface of the substrate 1, deposition of a silicon-nitride (Si3N4) layer 6 above the sacrificial polycrystalline-silicon layer 5 (FIG. 2a), and then the carrying-out of an anisotropic etch of the substrate 1 through an opening 7 made in the silicon-nitride layer 6 (FIG. 2b). By means of the anisotropic etch, the sacrificial polycrystalline-silicon layer 5 and part of the substrate 1 are thus removed, and a cavity or air-gap 8 is obtained having a roughly triangular cross section, which is separated from the outside environment by a diaphragm 9 consisting of the portion of the silicon-nitride layer 6 overlying the cavity 8, and on which the inductor can subsequently be made.

This technique presents some drawbacks that do not enable adequate exploitation of all its advantages.

In the first place, for the formation of the cavity 8 the above technique requires the deposition, and the corresponding definition through a special mask, of a sacrificial polycrystalline-silicon layer 5, with the costs associated thereto.

In the second place, the said technique does not enable a uniform isolation level to be obtained underneath the inductor, in that isolation is maximum at the center of the cavity 8 (i.e., at the vertex that is set further down of the triangle) whilst it is minimum at the ends of the cavity 8 (i.e., at the two vertices of the triangle that are set higher up). Consequently, in order to guarantee a minimum level of isolation of the inductor that may be acceptable over the entire extent of the latter, it is typically necessary to provide a cavity, the top area of which is larger than the area of the inductor, with a consequent larger area occupied on the silicon with respect to the one that would be occupied if the known technique illustrated in FIGS. 1a–1c were instead used.

SUMMARY OF THE INVENTION

According to the principles of the invention, a buried cavity is formed in a semiconductor material wafer. A mask is formed on the surface of the semiconductor material wafer. There is, in the mask, a lattice region. The lattice region has a plurality of openings or holes that are generally square or rectangular in shape. The lattice is oriented to a line that is inclined at between 30° and 60° with respect to a particular crystallographic plane of the wafer.

The wafer is anisotropically etched, such that cavities form under the holes in the lattice region of the mask. as the etch runs under the mask in a direction parallel to a crystallographic plane of the substrate, the holes join together to form a single cavity under the lattice region of the mask. The top and bottom walls of the cavity are substantially parallel, while the side walls slope inward from the top. A chemical vapor deposition is carried out, forming a TEOS layer, which completely closes the openings in the mask, resulting in a thin wall or diaphragm above a sealed cavity.

BRIEF DESCRIPTION OF THE DRAWINGS

For a better understanding of the present invention, preferred embodiments thereof are now described, merely to provide non-limiting examples, with reference to the attached drawings, in which.

DETAILED DESCRIPTION OF THE INVENTION

Figure 3:
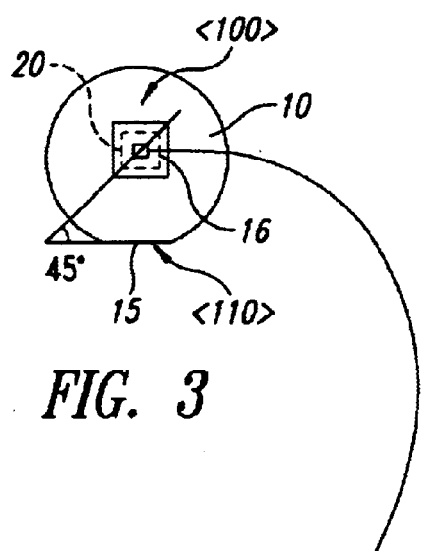
FIG. 3 shows a top view of a semiconductor material wafer in which the cavity has a pre-set orientation with respect to the wafer.

FIG. 3 shows a wafer in which a cavity or air gap 20 is formed using a holed mask 16 having openings oriented at a selected angle with respect to a particular crystallographic plane of the wafer 10.

As is known, a crystal of a semiconductor wafer has a number of crystallographic planes, among them <110>, <100>, <111>. As shown in FIG. 3, some wafers, as provided to the semiconductor manufacturer have a flat 15 which has been previously formed along the crystallographic plane <110>. For those wafers having a flat 15, which is previously formed on the <110> plane, the side walls of the holes 18 are aligned at approximately 45° to this flat 15.

In other embodiments of the invention, the flat is on a different plane, other than the <110> plane and thus, different mask configurations may be used, which are aligned at angles of between 30° and 60° of that plane. Alternatively, some semiconductor wafers do not contain the flat 15. Instead, they use other methods for identifying the crystallographic orientation of a plane. In the semiconductor industry, many different techniques are used for providing indicia of the crystallographic orientation of the wafer. It has been known, for example to use notches at selected locations on the wafer, inscribed laser markings, or other indicia showing the orientation of the crystallographic planes of the wafer. Generally, most semiconductor wafers manufactured today have, on the surface, an orientation of <100>. Thus, instead of using the flat of the wafer 15, some other method may be used to ensure that the orientation of the lattice structure is at the desired angle, relative to the selected plane.

Figure 5:
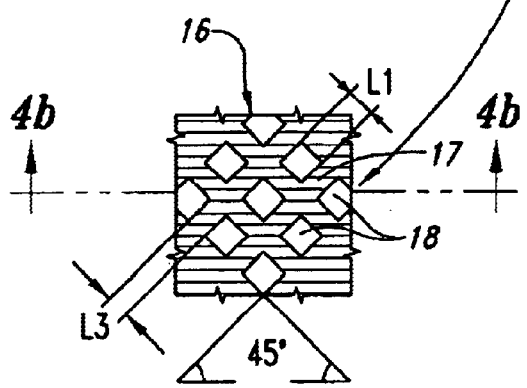
FIGS. 5 and 6 show portions of masks used during the forming process according to the present invention.

In FIG. 3, the flat 15 is identified by the orientation <110>, as is shown in the detail of FIG. 5, while the surface of the wafer 10 has an orientation <100>.

Figure 4A:
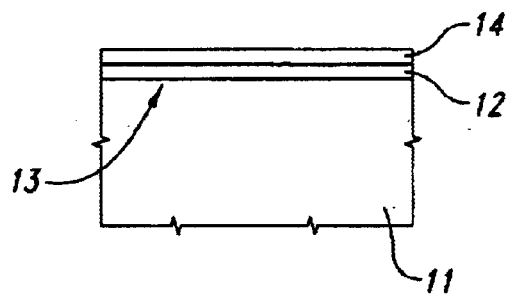
FIGS. 4a–4d show cross sections of the wafer of FIG. 3 at an enlarged scale in successive forming steps, according to the present invention.

For forming the cavity 20, according to what is illustrated in FIGS. 4a–4d, directly on the top surface 13 of a P or P+ monocrystalline silicon substrate 11 (i.e., without the interposition of a sacrificial polycrystalline-silicon layer), a first silicon-dioxide layer 12 is initially grown having a thickness of between 200 Å and 600 Å, and a silicon-nitride layer 14 is next deposited thereon having a thickness of between 900 and 1500 Å (FIG. 4a).

Figure 4B:
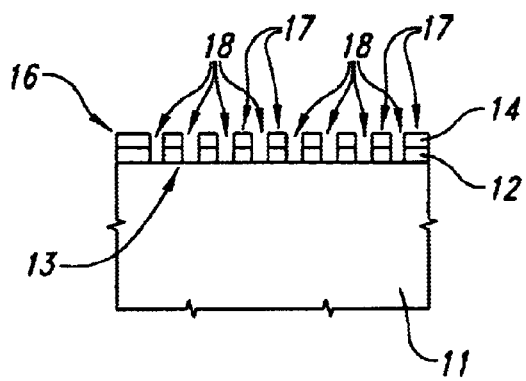

Next, using a resist mask (not shown), dry etching is carried out on the uncovered portions of the silicon-nitride layer 14 and of the silicon-dioxide layer 12, and the resist mask is then removed. In this way, the portions of the silicon-nitride layer 14 and of the silicon-dioxide layer 12 that have remained after the dry etching form the holed mask 16 as shown in FIG. 4b in cross-section and FIG. 5 in a top view.

As is illustrated in detail in FIG. 5, the holed mask 16 has a lattice structure provided with interstitial openings 18 having a substantially square cross section, with sides having a length L1 of, for example, between 1 $\mu$m and 3 $\mu$m, preferably 2 $\mu$m, and an inclination of 45°±1° with respect to the "flat" of the wafer 10, and thus, to the <110> plane. In some embodiments, the distance L3 is comparable to the length L1, and hence, for example, a distance of between 1 $\mu$m and 3 $\mu$m while in other embodiments, it may be larger or smaller. A region 17 between the apertures 18 forms distinct support columns on either side of which exist the apertures 18. Columns 17, interspersed with the apertures 18, form a lattice structure which is positioned over the semiconductor surface as shown in FIG. 4b in preparation for etching.

Other mask configurations and angles may be used when the flat of the wafer, or other indicia, is not aligned with the <110> plane. For example, the angle may be between 30° to 60° for other orientations. In general, the angle range depends on the crystallographic orientation of the wafer relative to the mask.

Figure 4C:
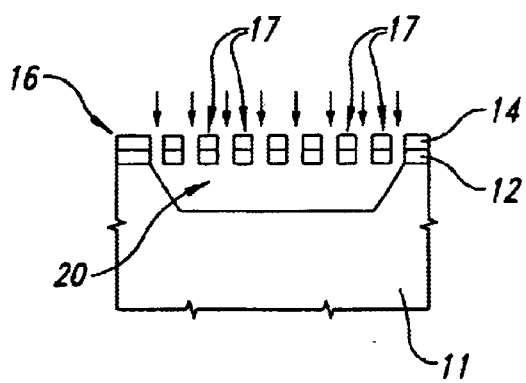
Figure 4D:
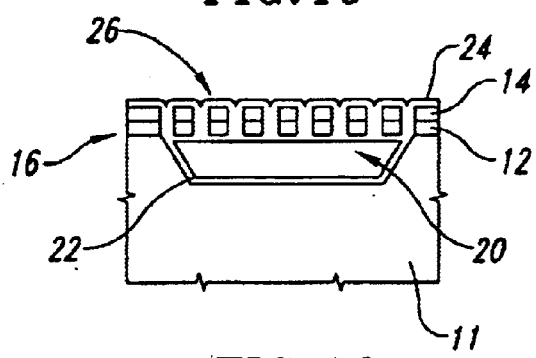

Using the holed mask 16, the substrate 11 is then anisotropically etched under time control in tetramethyl ammonium hydroxide (TMAH), thus forming the cavity 20, which substantially has the shape of an isosceles trapezium turned upside down and a depth of between 50 $\mu$m and 100 $\mu$m (FIG. 4c).

In particular, the shape of an upside-down isosceles trapezium of the cavity 20 is obtained thanks to the combination of the following factors: execution of an anisotropic etch; use of a holed mask 16; and orientation at 45° of the openings 18 with respect to the "flat" of the wafer 10.

In fact, with the particular combination described above, the individual etches having their origin from the openings 18 of the holed mask 16 are performed on particular crystallographic planes of the silicon which enable the individual etches to "join up" laterally to one another, thus causing removal of the silicon not only in the vertical direction (i.e., in the direction of the depth of the substrate 11), but also in the horizontal direction (width/length), thus leading to the formation of the cavity 20 having the shape shown in FIG. 4c.

Figure 1A:
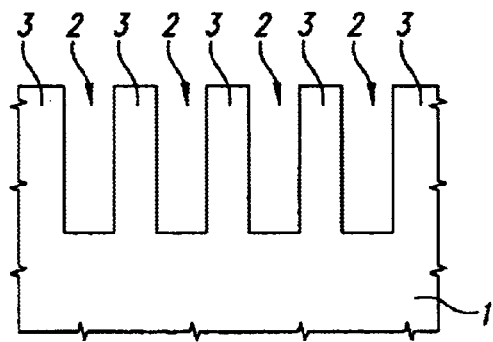
FIGS. 1a–1c show cross sections of a semiconductor material wafer in successive steps of a first known forming process.
Figure 2A:
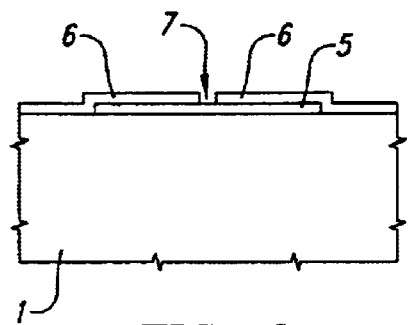
FIGS. 2a–2c show cross sections of a semiconductor material wafer in successive steps of a second known forming process.
Figure 1B:
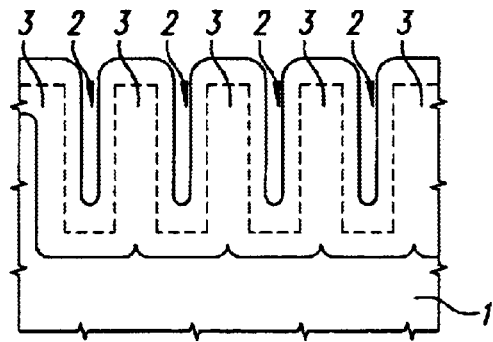
Figure 2B:
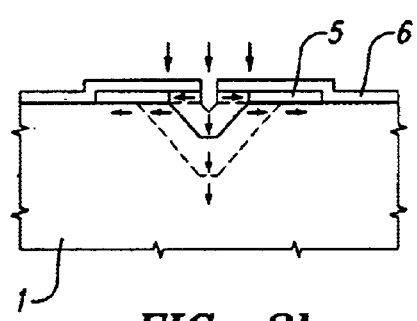
Figure 1C:
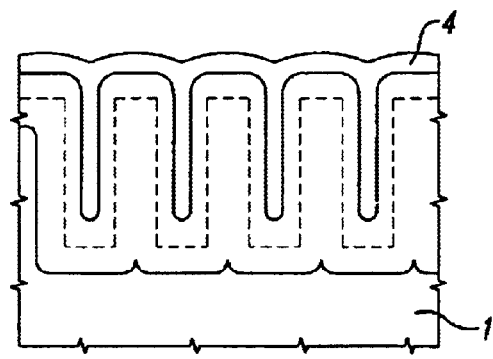
Figure 2C:
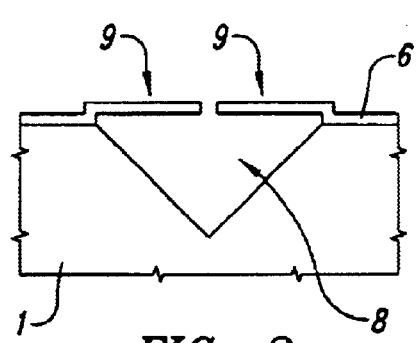

If, instead, the mask were oriented such that the openings 18 of the holed mask 16 had sides parallel or orthogonal to the "flat" of the wafer 10, the individual etches having their origin from the opening 18 of the holed mask 16 would be performed on crystallographic planes of the silicon that would not enable the individual etches to "join up" laterally to one another, thus leading to the formation of a set of cavities, equal in number to the openings 18 of the holed mask 16, separate from one another, and each having a cross section shaped like an upside-down triangle, of the same type as that shown in FIG. 2c.

Figure 6:
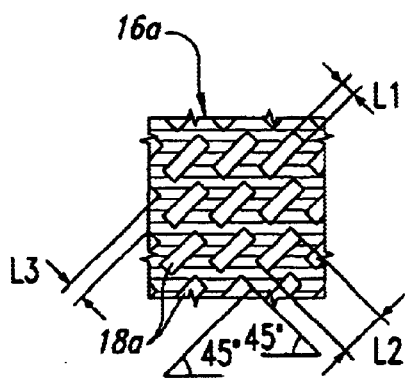

According to the principles of the invention, one factor in determining the configuration and the angle of orientation of the lattice structure is that as the etch progresses in the substrate underneath the lattice structure from one opening it must eventually meet up with another opening, as can be observed in FIGS. 5 and 6. The distance L3 is selected to permit proper etching while ensuring that the individual etches join up to form a single large cavity. Thus, in some instances, L3 could be large, compared to L1, while in other designs, it will approximately equal L1.

The use of TMAH for carrying out anisotropic etching of the substrate 11 is moreover particularly advantageous in combination with the structure of the holed mask 16 described above for leading to the formation of the cavity 20 having the shape illustrated in FIG. 4c, in that also this contributes to lateral joining-up of the individual etches.

With reference again to FIGS. 4a–4d, following upon TMAH anisotropic etching, a chemical vapor deposition (CVD) of tetraethyl orthosilicate (TEOS) is carried out for a thickness of 2 µm, which leads to the formation of a coating layer 22, which is thinner and which coats the side walls and bottom wall of the cavity 20, and of a closing layer 24 which completely closes the openings of the holed mask 16 (FIG. 4d).

The closing layer 24 is preferably formed of the same material as the coating layer 22, as part of a continuation of the same step such as CVD of TEOS. Namely, as the TEOS layer is formed on the individual side walls of the mask 17. As the coating layers build up, the deposited material between one mask portion 17 and another mask portion 17 will bridge over, so as to provide a complete block and provide for the formation of a top wall or diaphragm 26.

A suspended structure can thereafter be made in, or on top of the top wall 26, as desired. The method of making such a suspended structure is well known in the art and therefore need not be described in detail. For example, those skilled in the art will understand that an inductor, a resistor, or other appropriate component can be formed in, on, or above the diaphragm 26 using techniques currently available in the art.

The advantages of the process according to the present invention are described in what follows.

In the first place, forming cavities according to the present invention does not entail the deposition, and the corresponding definition through a dedicated mask, of a special polycrystalline-silicon layer; the fabrication process is consequently simpler and more economical, thanks to the reduction in the number of the steps required, and in particular to the elimination of the mask necessary for the definition of the sacrificial polycrystalline-silicon layer.

In the second place, the process described enables the fabrication of a cavity 20 the shape of which makes it possible to achieve a uniform isolation level beneath the electronic component (inductor, resistor, etc.) made on the diaphragm 26 overlying the cavity 20, thus reducing occupation of the area on silicon with respect to that which there would be if the prior art techniques shown in FIGS. 2a–2c were used.

In addition, the present process can be employed for the formation of cavities having, in plan view, any shape whatsoever, and even elongated cavities defining true buried channels.

Finally, it is clear that numerous modifications and variations can be made to the process described and illustrated herein, without thereby departing from the sphere of protection of the present invention, as defined in the attached claims.

For example, the holed mask used in the process could also present a different pattern of the openings. For instance, it is possible to use the pattern shown in FIG. 6, in which the holed mask 16a has openings 18a having a substantially rectangular shape, with the smaller side having a length L1 of, for example, between 1 µm and 3 µm, preferably 2 µm, and the larger side having a length L2 of, for example, between 1 µm and 10 µm, preferably 5–7 µm, and an inclination of 45° with respect to the "flat" of the wafer 10. The distance L3 between the openings 18a is preferably comparable with that of the smaller side L1, and is hence, for example, between 1 µm and 3 µm.

In addition, the openings 18a are arranged in parallel rows, and the openings 18a belonging to adjacent rows are staggered with respect to one another.

Furthermore, the openings 18a could present a shape slightly different from that illustrated in FIG. 6. In particular, they could present any shape elongated along a prevalent direction having the inclination referred to above with respect to the "flat" of the wafer 10, for example the shape of a flattened ellipse, a generally quadrangular elongated shape, etc.

Figure 7A:
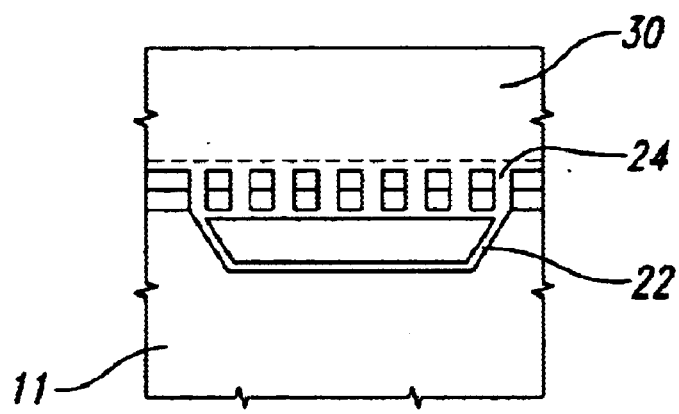
FIGS. 7a and 7b show cross sections of the wafer of FIG. 4d in successive forming steps, according to a different embodiment of the invention.
Figure 7B:
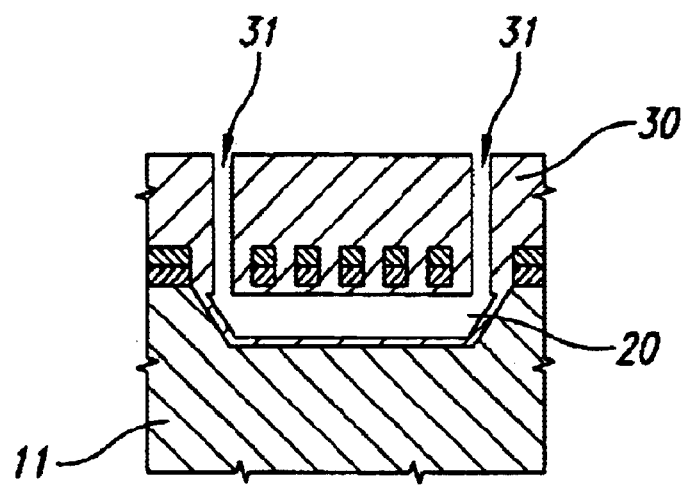

Finally, the same process can be used to make buried channels connected with the outside world at communication openings, for example elongated channels having two opposite ends and being connected via communication openings set at the ends of the channels themselves. In this case, the openings 18, 18a of the holed mask 16, 16a are arranged so as to obtain the desired shape for the cavity 20 or for a plurality of cavities 20. In addition, instead of depositing TEOS after the formation of the cavity 20, polycrystalline silicon is deposited, which comes to form the coating layer 22 and the closing layer 24. Next, as shown in FIG. 7a, an epitaxial layer 30 is grown so as to strengthen the diaphragm 26. Finally, using known etching techniques, the openings 31 are made at the two ends of the cavity or of each cavity 20 (FIG. 7b), so as to form areas of access to the cavity or cavities 20. This solution is particularly suited for the fabrication of microreactors for the DNA chain reaction. From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for forming a buried cavity in a semiconductor material body, comprising the steps of:

forming a mask on top of said semiconductor material body; said mask having a plurality of openings, each having a side or a prevalent direction with an inclination of between 44° and 46° with respect to a particular crystallographic plane of said semiconductor material body;

anisotropically etching said semiconductor material body using said mask;

forming, above said mask, a polycrystalline-silicon coating layer closing said openings growing an epitaxial layer on said coating layer; and forming communication openings extending in said epitaxial layer and in said coating layer as far as said cavity.

2. The process according to claim 1, wherein said openings have a side or a prevalent direction with an inclination of 45° with respect to said particular crystallographic plane of said semiconductor material body.

3. The process according to claim 2, wherein said openings have a quadrangular shape.

4. The process according to claim 3, wherein said openings have a substantially square shape.

5. The process according to claim 3, wherein said openings have a substantially rectangular shape.

6. The process according to claim 5, wherein said openings are arranged in parallel rows.

7. The process according to claim 6, wherein said openings belonging to adjacent rows are staggered with respect to one another.

8. The process according to claim 1, wherein said mask has a lattice structure.

9. The process according to claim 1, wherein said mask is made directly above a surface of said semiconductor material body.

10. The process according to claim 1, wherein said anisotropic etching step is carried out using TMAH.

11. The process according to claim 1, wherein said anisotropic etching step is time-controlled.

12. The process according to claim 1, wherein said step of forming a coating layer comprises carrying out TEOS chemical vapor deposition.

13. The process according to claim 1, wherein said mask is a hard mask comprising oxide portions in contact with said semiconductor material body and silicon-nitride portions above said oxide portions.

14. A method comprising:

forming a mask on top of a semiconductor material body, said mask having a plurality of openings, said openings configured such that, an anisotropic etch traveling from one of said plurality of openings, under said mask, along a crystallographic plane of said semiconductor material body, will intersect another of said plurality of openings;

anisotropically etching said semiconductor material body using said mask, for a time period sufficient that a single cavity is formed underneath said mask;

forming a coating layer above said mask and in said openings, thereby closing said openings; and forming a communication opening extending in said coating layer as far as said cavity.

15. The method of claim 14, further comprising forming an epitaxial layer on said coating layer, and wherein said forming a communication opening step includes forming a communication opening extending in said epitaxial layer.

16. The method of claim 14, further comprising forming a plurality of communication openings extending in said coating layer as far as said cavity, and wherein said forming a communication opening step is included in said forming a plurality of communication openings step.

17. The method of claim 14 wherein the coating layer is a polycrystalline-silicon coating layer.

* * * * *